(12) United States Patent
Yajima et al.

(10) Patent No.: US 7,484,280 B2
(45) Date of Patent: Feb. 3, 2009

(54) METHOD FOR MANUFACTURING A SURFACE ACOUSTIC WAVE ELEMENT HAVING AN INTERDIGITAL TRANSDUCER (IDT) ELECTRODE

(75) Inventors: Aritsugu Yajima, Matsumoto (JP); Takamitsu Higuchi, Matsumoto (JP); Yoshikazu Kasuya, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/624,092

(22) Filed: Jan. 17, 2007

(65) Prior Publication Data
US 2007/0169324 A1    Jul. 26, 2007

(30) Foreign Application Priority Data
Jan. 20, 2006   (JP)   .............................. 2006-012058

(51) Int. Cl.
*H01L 41/22*   (2006.01)

(52) U.S. Cl. ........................... 29/25.35; 29/830; 29/831; 29/832; 29/846; 29/847; 310/313 R

(58) Field of Classification Search ................. 29/25.35, 29/830, 832, 831, 846, 847, 594, 595; 310/313 R, 310/313 B, 313 A, 365, 322; 333/141, 190, 333/193; 438/295, 296, 216, 226
See application file for complete search history.

(56) References Cited

U.S. PATENT DOCUMENTS

| 5,221,870 A | * | 6/1993 | Nakahata et al. | ........ 310/313 A |
| 5,440,189 A | * | 8/1995 | Nakahata et al. | ........ 310/313 R |
| 5,459,368 A | * | 10/1995 | Onishi et al. | ............ 310/313 R |
| 6,046,656 A | * | 4/2000 | Mishima | ..................... 333/141 |

FOREIGN PATENT DOCUMENTS

| JP | A 5-152881 | 6/1993 |
| JP | A-10-112624 | 4/1998 |
| JP | A 2002-33410 | 1/2002 |
| KR | A-10-2004-0092728 | 11/2004 |

* cited by examiner

*Primary Examiner*—Peter Vo
*Assistant Examiner*—Tai Nguyen
(74) *Attorney, Agent, or Firm*—Oliff & Berridge, PLC

(57) ABSTRACT

A method for manufacturing a surface acoustic wave element having an interdigital transducer (IDT) electrode formed on a semiconductor substrate includes a) forming an insulation layer on a surface of an active side of the semiconductor substrate, b) forming a base layer on a whole surface of the insulation layer, c) planarizing a surface of the base layer, d) forming a piezoelectric member on a planarized surface of the base layer, e) forming the IDT electrode on a surface of the piezoelectric member, and f) forming a bank being higher than a height from the surface of the base layer to the surface of the IDT electrode on a peripheral of the surface of the base layer so as to surround the piezoelectric member.

8 Claims, 6 Drawing Sheets

METHOD FOR MANUFACTURING A SURFACE ACOUSTIC WAVE ELEMENT HAVING AN INTERDIGITAL TRANSDUCER (IDT) ELECTRODE

BACKGROUND

1. Technical Field

The present invention relates to a method for manufacturing a surface acoustic wave element and the surface acoustic wave element manufactured by the method. In particular, it relates to a method for manufacturing the surface acoustic wave element provided with an interdigital transducer (IDT) inside of a recess formed in the center of the surface of a semiconductor substrate by a bank formed around the edge thereof, and a structure of the surface acoustic wave element.

2. Related Art

In recent years, mobile electronic apparatuses such as cellular phones become popular, and further, those apparatuses are required to be sophisticated and downsized. Therefore, electronic devices used for the mobile electronic apparatuses are also required to be downsized.

As for techniques to downsize such electronic devices, a functional device unit provided with a semiconductor element chip and a method for manufacturing the functional device are commonly known. The functional device unit includes an insulation substrate made of silicon (a Si substrate) having a recess on its surface and a ditch formed in an insulation film formed in the recess including the bottom and the side thereof, and on the top surface of the substrate, a wiring layer patterned in the ditch continuously from the bottom of the recess to the top surface via the side thereof, a semiconductor element chip which is flip-chip mounted between the wiring layers in the recess, and the recess being sealed with resin. (for example, JP-A-2002-33410 (No. 5, page 6, FIG. 2))

Alternatively, a method for manufacturing a surface acoustic wave element module is also known. In the method, the surface acoustic wave element (in a chip state) is arranged in a recess formed on a module substrate made of ceramic, and a sub substrate provided with a peripheral circuit is electrically coupled to the surface acoustic wave element. The surface acoustic wave element is sealed in the recess by the sub substrate. (for example, JP-A-5-152881(No. 3, page 4, FIGS. 2 and 3))

In JP-A-2002-33410 (No. 5, page 6, FIG. 2), the functional device unit is formed with a semiconductor element chip that is flip-chip mounted in a recess of an insulation substrate and sealed with resin. In this structure, even though the semiconductor element chip is accommodated in the recess of the substrate, the functional device unit needs to have a certain thickness for the bottom of the substrate corresponding to the semiconductor element chip and the sealing resin layer. Moreover, the size cannot be reduced to less than that of the substrate itself. Therefore, even if this semiconductor element chip is replaced with the surface acoustic wave element of the invention to be described below, it is still hard to attain a thin and small-sized surface acoustic wave element because of the reasons described above.

Further, when this semiconductor element chip is mounted on a functional device unit for electronic apparatuses or the like, it needs to be coupled with an outside circuit. Therefore, another step for coupling is necessary after the semiconductor element chip is flip-chip mounted on a substrate, thereby at least two mounting steps are required in total. The manufacturing process thus becomes longer. In addition, since a substrate to mount a semiconductor element chip is needed, it is hard to reduce the cost.

Further, according to JP-A-5-152881 (No. 3, page 4, FIGS. 2 and 3), an surface acoustic wave element (in a chip state) is arranged in a recess formed on a module substrate, and followed by sealing the recess having the surface acoustic wave element inside by the sub substrate, thereby protecting the surface of the surface acoustic wave element from contamination or the like. However, a module substrate, a surface acoustic wave element, and a sub substrate are individually formed and mounted on a surface acoustic wave element module, limiting the surface acoustic wave element module to be thin. In addition, increase of manufacturing steps such as mounting steps cannot be avoided.

Furthermore, for an IDT electrode forming region of the surface acoustic wave element, flatness and smoothness are highly required to obtain a predetermined resonance characteristic as it is known. However, it is assumed that the surface of a wiring pattern formed on the bottom of the recess on the module substrate according to JP-A-5-152881 (No. 3, page 4, FIGS. 2 and 3) described above is hard to be flattened and smoothed. Accordingly, accurate characteristics such as resonance frequency seem hard to obtain.

SUMMARY

An advantage of the invention is to provide a thin and small-sized surface acoustic wave element with high reliability, enabling to facilitate packaging, and a method for manufacturing the surface acoustic wave element.

According to a first aspect of the invention, a method for manufacturing a surface acoustic wave element having an IDT electrode formed on a semiconductor substrate includes a) forming an insulation layer on a surface of an active side of the semiconductor substrate, b) forming a base layer on a whole surface of the insulation layer, c) planarizing a surface of the base layer, d) forming a piezoelectric member on a planarized surface of the base layer, e) forming the IDT electrode on a surface of the piezoelectric member, and f) forming a bank being higher than a height from the surface of the base layer to the surface of the IDT electrode on a peripheral of the surface of the base layer so as to surround the piezoelectric member.

Here, the semiconductor substrate is made of Si and includes a circuit element such as an oscillation circuit. The surface acoustic wave element is provided with the piezoelectric member and the IDT electrode thereon. The surface acoustic wave element has a recess formed by the bank surrounding the piezoelectric member and the IDT electrode. Therefore, the surface of the IDT electrode does not protrude above the surface of the bank, resulting in reducing a risk in which the IDT electrode is damaged by contact with jigs or the like during packaging later, and providing the surface acoustic wave element with high reliability.

In addition, the outer shape is within a region of the semiconductor substrate without any protrusions, enabling downsizing.

In the method described above, a surface acoustic wave element can be manufactured in a wafer state throughout a semiconductor manufacturing process. According to JP-A-5-152881 (No. 3, page 4, FIGS. 2 and 3) described above, steps for mounting a surface acoustic wave element that is made into a chip, a sub substrate, and a module substrate are unnecessary, resulting in shortening the manufacturing process and reducing manufacturing cost.

Furthermore, the base layer for the piezoelectric member to be formed is formed on the whole surface of the insulation layer having no protrusions, and then the surface of the base layer is planarized. Therefore, a region for forming the surface acoustic wave element is highly planarized and smoothed, thereby providing a highly accurate resonance characteristic.

For planarization, for example, chemical and mechanical polishing (CMP) or the like is preferable.

Further, step b) preferably includes forming a single insulation layer. For the insulation layer forming the base layer can be made of silicon nitride (SiN), for example.

The base layer is formed on the surface of the insulation layer provided on the surface of the active side of the semiconductor substrate. If the insulation layer is silicon oxide ($SiO_2$), SiN is easily formed in a common semiconductor manufacturing process. SiN is generally known as a material that is easy to be planarized by CMP.

Further, step b) preferably includes forming the base layer by laminating an Al layer and the insulation layer, and planarizing at least a surface of the Al layer.

Here, the Al layer and the SiN layer forming the base layer can be laminated to form a two-layered structure in the order that is the Al layer and the SiN layer, or the SiN layer and the Al layer, from the uppermost layer of the insulation layer ($SiO_2$) on the surface of the semiconductor substrate. Alternatively, the base layer can have a three-layered structure by laminating the SiN layer, the Al layer, and another SiN layer. The Al layer is often used as a metal stopper for planarization and smoothing treatment in the semiconductor manufacturing process and can have high flatness and smoothness by planarization. The region for forming the surface acoustic wave element with high flatness and smoothness can make the resonance characteristic further accurate.

In addition to the Al layer, it is preferable that SiN layer be also planarized.

Further, step f) preferably includes forming a bank layer to be as high as the bank on the surface of the base layer and forming a recess by removing the bank layer by etching to reach the surface of the base layer in a region to form the piezoelectric member, and the piezoelectric member in step d) is formed on a bottom of the recess followed by forming the IDT electrode on the surface of the piezoelectric member.

The peripheral of the recess is the bank.

Accordingly, the planarized surface of the base layer is exposed at the bottom of the recess, providing flatness of the piezoelectric member itself and a resonance characteristic with high accuracy.

This bank can also be easily and accurately formed in a wafer state throughout a semiconductor manufacturing process.

Further, step e) may be followed by step f), and step f) preferably includes forming the bank in a predetermined shape by discharging a liquid member having a precursor compound for $SiO_2$ in a region to form the bank on the peripheral of the surface of the base layer using a droplet discharge method, and solidifying the liquid member by heat treatment.

Therefore, the bank can be formed in an arbitrary shape by the droplet discharge method while a through hole to form a via hole is formed in a part of the bank in the same step, thereby the manufacturing process can be shortened. Further details will be explained in embodiments later.

In addition, the piezoelectric member and the IDT electrode are formed to be flush with each other on the base layer that is planarized and has no protrusions. Therefore, the piezoelectric member and the IDT electrode are formed more easily than the method to form them in the recess preliminarily formed as described above.

Further, step f) may be followed by forming the piezoelectric member on the planarized surface of the base layer in a recess formed by the bank and step e), and step f) preferably includes forming the bank in a predetermined shape by discharging a liquid member having a precursor compound for $SiO_2$ in a region to form the bank on the peripheral of the surface of the base layer using a droplet discharge method, and solidifying the liquid member by heat treatment.

A step after forming the bank using the droplet discharge method, forming the recess by etching described above, that is, the same step as the one after forming the bank can be employed.

According to the method like this, when the bank is formed, the surface of the base layer can avoid being in contact with an etchant or the like, keeping the surface of the base layer as it is planarized, improving bonding reliability with the piezoelectric member.

Further, in the method for manufacturing a surface acoustic wave element, it is preferable that the bank be made of $SiO_2$ and formed by solidifying a precursor compound for $SiO_2$ that is a liquid member including an organic metal compound $Si(OR)4(R=CH3, C2H5, C3H7, C4H9)$ with heat treatment.

The precursor compound for $SiO_2$ made as above can be formed in a desired shape and height for the bank with the droplet discharge method as required, and then solidified with heat treatment, easily forming the bank made of $SiO_2$ in the desired shape.

Further, the temperature of the heat treatment is preferably in a range from 350 to 400 degrees centigrade.

The heat treatment at the temperature in such a range can ensure the liquid member to be solidified, and prevent heat influence on a circuit element and wiring on the semiconductor substrate.

Further, according to a second aspect of the invention, a surface acoustic wave element having an IDT electrode formed on a semiconductor substrate includes an insulation layer formed on a surface of an active side of the semiconductor substrate, a base layer formed on a whole surface of the insulation layer and planarized, a piezoelectric member formed on a planarized surface of the base layer, the IDT electrode formed on a surface of the piezoelectric member, a bank formed being higher than the height from the surface of the base layer to the surface of the IDT electrode on a peripheral of the surface of the base layer so as to surround the piezoelectric member.

According to the second aspect of the invention, the surface acoustic wave element has a recess formed by the bank surrounding the piezoelectric member and the IDT electrode. Therefore, the surface of the IDT electrode does not protrude above the surface of the bank, resulting in reducing a risk in which the IDT electrode is damaged by contact with jigs or the like during a circuit mounting step or the like later, or contact with a lid during packaging, and providing the surface acoustic wave element with high reliability.

In addition, the outer shape is within the region of the semiconductor substrate without any protrusions, enabling downsizing.

Furthermore, the base layer for the piezoelectric member to be formed is formed on the whole surface of the insulation layer having no protrusions, and then the surface of the base layer is planarized. Therefore, a highly planarized and smoothed region for forming the surface acoustic wave element is provided, thereby making the resonance characteristic highly accurate.

In addition, for the surface acoustic wave element, it is preferable that a sealing member to seal a recess formed by the bank be further provided on a top surface of the bank and packaged.

The recess formed by the bank is sealed with the sealing member, protecting the IDT electrode from water and dust from outside.

BRIEF DESCRIPTION OF THE DRAWINGS

The invention will be described with reference to the accompanying drawings, wherein like numbers reference like elements.

FIG. 1A is a plan view thereof. FIG. 1B is a cross-sectional view taken along the line A-A in FIG. 1A.

DESCRIPTION OF EXEMPLARY EMBODIMENTS

Embodiments of the invention will now be described with reference to the drawings below.

Figure 1A:
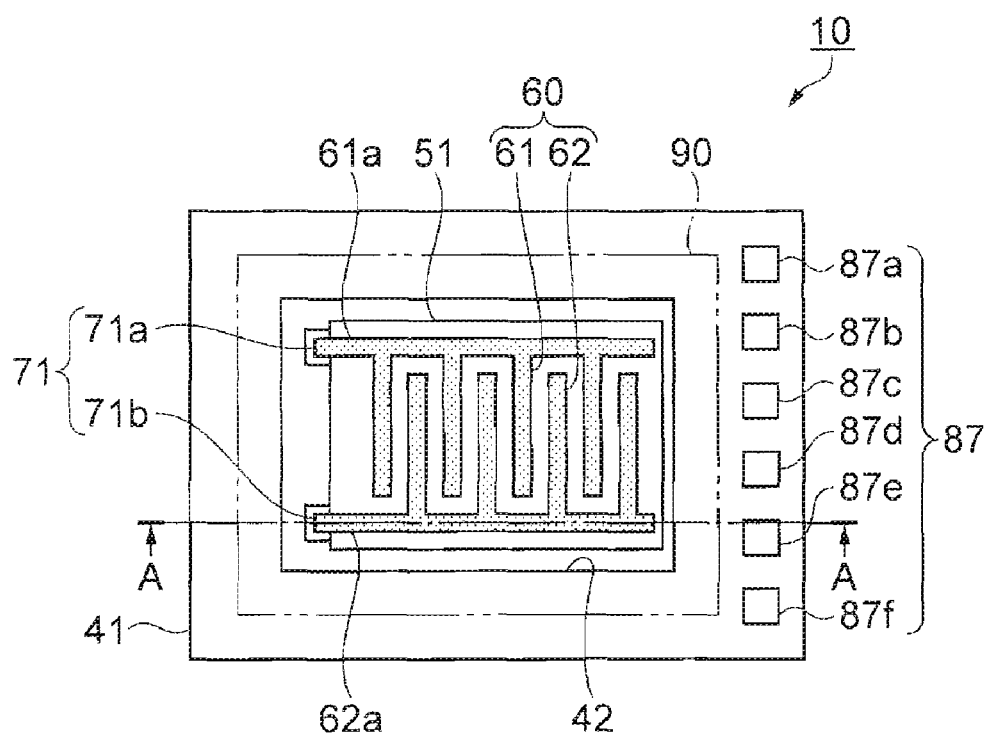
FIGS. 1A and 1B show a schematic structure of a surface acoustic wave element according to the invention.
Figure 1B:
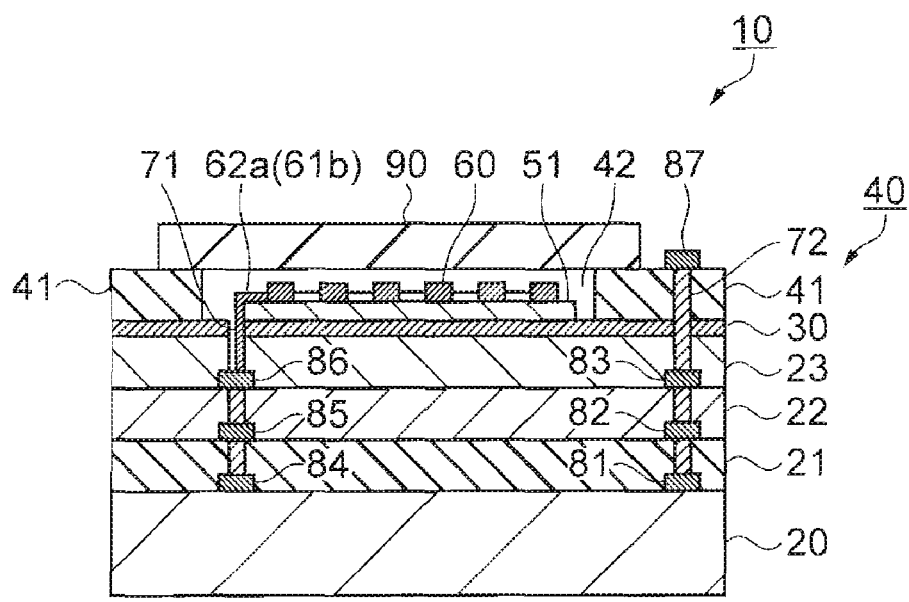
Figure 2A:
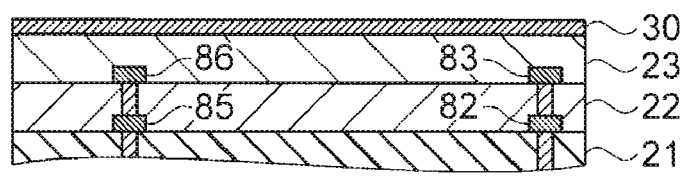
FIGS. 2A through 2F are schematic sectional-views showing manufacturing steps for the surface acoustic wave element according to a first embodiment of the invention.
Figure 2B:
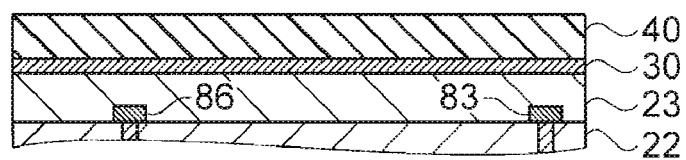
Figure 3A:
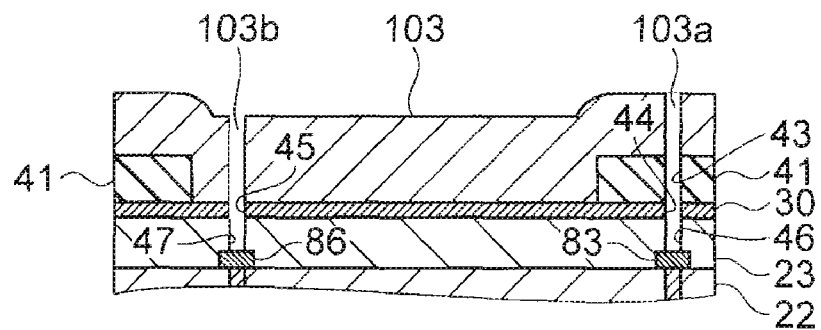
FIGS. 3A through 3E are schematic sectional-views showing the manufacturing steps for the surface acoustic wave element according to the first embodiment of the invention.
Figure 4:
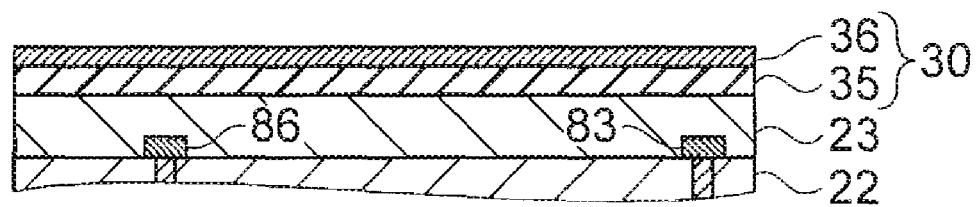
FIG. 4 is a schematic sectional-view showing a part of manufacturing steps for a surface acoustic wave element according to a second embodiment of the invention.
Figure 5:
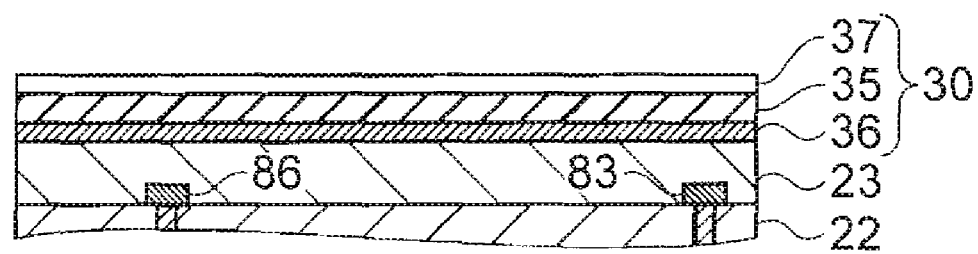
FIG. 5 is a schematic sectional-view showing a part of a modification of the second embodiment of the invention.

FIGS. 1A and 1B show a structure of a surface acoustic wave element according to the invention. FIGS. 2A through 2F and FIGS. 3A through 3E show a method for manufacturing a surface acoustic wave element according to a first embodiment of the invention. FIGS. 4 and 5 show a method for manufacturing a surface acoustic wave element according to a second embodiment and a modification thereof. FIGS. 6A through 6H show a method for manufacturing a surface acoustic wave element according to a third embodiment while FIGS. 7A through 7H show a method for manufacturing a surface acoustic wave element according to a fourth embodiment.

[Structure of Surface Acoustic Wave Element]

FIGS. 1A and 1B show a schematic structure of a surface acoustic wave element according to the invention. FIG. 1A is a plan view thereof. FIG. 1B is a cross-sectional view taken along the line A-A in FIG. 1A. FIG. 1A shows the state seen through a lid 90. A surface acoustic wave element 10 in FIGS. 1A and 1B includes a semiconductor substrate 20 made of silicon (Si), insulation layers 21 to 23 made of silicon oxide ($SiO_2$) and formed on a surface of an active side of the semiconductor substrate 20, a base layer 30 formed on the whole surface of the insulation layer 23 located on the top of the layers, a piezoelectric member 51 made of a piezoelectric material as typified by zinc oxide (ZnO) and formed on the surface of the base layer 30, and an interdigital transducer (IDT) electrode 60 in a comb-teeth shape made of Al on the top surface of the piezoelectric member 51.

The semiconductor substrate 20 is provided with a circuit element (not shown) such as an oscillation circuit. Interlayer electrodes (not shown) are respectively formed in between each of the insulation layers 21 to 23 and provided with pads 81 to 86. The interlayer electrodes located above and below are electrically coupled to each other through a via hole (contact hole). Further, these interlayer electrodes also serve as connection electrodes coupling circuit elements or the like on the semiconductor substrate 20. Each of these insulation layers 21 to 23 has a surface planarized and smoothed by a planarization such as chemical and mechanical polishing (CMP).

In addition, the semiconductor substrate 20 preferably has a passivation film formed on its surface. Further FIG. 1B shows a structure having three of the insulation layers as an example. However, the number of the insulation layers is not limited, that is, the insulation layers can be single or multiple layered.

The insulation layer 23 has the base layer 30 made of SiN formed on its surface. This base layer 30 has a surface planarized by CMP. Further, on the surface of the base layer 30, the piezoelectric member 51 having the IDT electrode 60 in a comb-teeth shape on its surface is formed.

On the peripheral of the surface of the insulation layer 23, a bank 41 is formed to surround the piezoelectric member 51 and the IDT electrode 60. The bank 41 is formed higher than the height from the surface of the base layer 30 to the surface of the IDT electrode 60.

On the top surface of the bank 41, the lid 90 is bonded as a sealing member to seal the space in the recess 42 formed by the bank 41. A material of the lid 90 is not limited. However, metal, glass, ceramic or the like can be employed, and metal material is effective for shielding.

The pad 87 is formed on the surface of the bank 41 located outside of the lid 90. In FIG. 1A, six of pads 87a to 87f are shown. Here, the pads 87a to 87f include at least a power supply electrode pad for driving an oscillation circuit, GND coupled to the IDT electrode 60, an input/output signal electrode pad and the like.

Hereinafter, the pads 87a to 87f are correctively referred to as the pad 87.

The IDT electrode 60 made of Al is formed by a GND electrode 61 in a comb-teeth shape and an input electrode 62, which is common with an output electrode, mutually crossed each other on the surface of the piezoelectric member 51. The IDT electrode 60 has bus bars. Ends of the bus bars on one side become connection electrodes 61a and 62a extended to respective end portions of the piezoelectric member 51, and further extended to via holes 71a and 71b to couple to the pad 86, Hereinafter, the via holes 71a and 71b may be correctively referred to as the via hole 71.

The pad 87 is also coupled to the pad 83 respectively formed between insulation layers via a via hole 72. In FIG. 1B, the pads 83 and 86 are shown one each. However, the pad 83 is formed to correspond to at least the power supply electrode pad for driving an oscillation circuit described above, and the pad 86 is formed to correspond to a GND an input/output signal electrode. The pads 81, 82, 84, and 85 are also formed to correspond to the pads 83 and 86.

Here, steps to form the semiconductor substrate 20 and the insulation layers 21 to 23 are known as a common process for manufacturing a semiconductor. Therefore, steps from the base layer 30 to the piezoelectric member 51, the IDT electrode 60, and the bank 41 will be explained as the manufacturing process of the surface acoustic wave element according to the invention.

In the surface acoustic wave element 10 according to the invention described above, the piezoelectric member 51 and the IDT electrode 60 are formed in the recess 42 surrounded by the bank 41. Therefore, the surface of the IDT electrode 60 does not protrude above the surface of the bank 41, resulting in reducing a risk in which the IDT electrode is damaged by contact with jigs or the like, or a back side of the lid 90 during manufacturing steps later, and facilitating packaging, moreover, providing the surface acoustic wave element with high reliability.

In addition, the outer shape is within a region of the semiconductor substrate 20 without any protrusions, enabling downsizing.

Further, the base layer 30 provided with the piezoelectric member 51 is formed on the whole surface of the insulation layer 23 having no protrusions, and then the surface of the base layer 30 is planarized. Therefore, a region for forming the surface acoustic wave element is highly planarized and smoothed, thereby making the resonance characteristic stable.

Furthermore, the recess 42 formed by the bank 41 is sealed with the lid 90, protecting the IDT electrode 60 from water and dust from outside, and providing the surface acoustic wave element 10 with high reliability.

First Embodiment

Subsequently, a method for manufacturing a surface acoustic wave element according to a first embodiment will be explained with reference to drawings.

FIGS. 2A through 2F and FIGS. 3A through 3E show schematic sectional-views showing manufacturing steps for the surface acoustic wave element 10 according to the first embodiment of the invention. Explanations and views of the common steps for semiconductor manufacturing process described above are omitted while the major manufacturing steps for the manufacturing process of the surface acoustic wave element 10 are explained with drawings.

First, the insulation layers 21 to 23 and the pads 81 to 86 are formed on the top surface of the semiconductor substrate 20 with common manufacturing steps for the semiconductor manufacturing process. As shown in FIG. 2A, the surface of the insulation layer 23 is planarized by CMP, followed by formation of the base layer 30 on the whole surface thereof.

After planarizing the surface of the base layer 30 by CMP, a bank layer 40 made of $SiO_2$ is formed on the whole surface of the base layer 30. (FIG. 2B) The height (thickness) of the bank layer 40 is higher than the surface of the IDT electrode 60 (see FIG. 1B), and is about 4 μm in this embodiment, Next, the bank 41 is formed by etching.

Figure 2C:
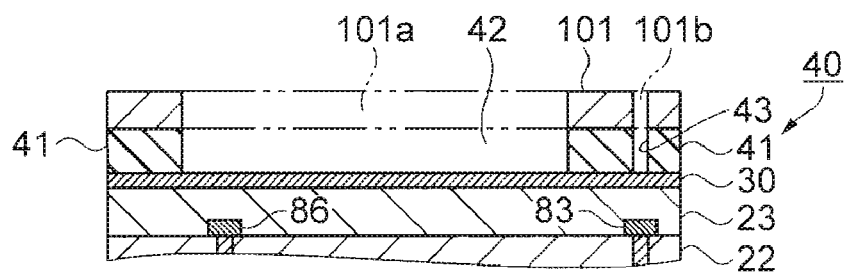

FIG. 2C shows a bank forming step. A resist layer 101 is formed on the surface of the bank layer 40. Then, the resist layer 101 is exposed and developed to form a resist pattern having an openings 101a and 101b. The opening 101a corresponds to the recess 42 to form the bank 41 while the opening 101b corresponds to the via hole 72 (see FIG. 1B) connecting the pad 87. The recess 42 and a through hole 43 to form the via hole 72 are formed by wet etching or dry etching. The peripheral of the recess 42 is the bank 41.

Thereafter, the resist layer 101 is removed and cleaned to form a resist layer 102.

Figure 2D:
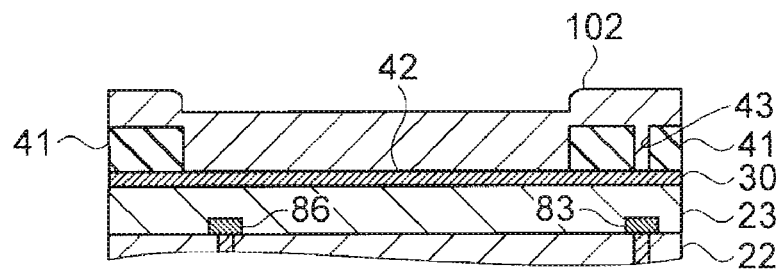

FIG. 2D shows a step for forming the resist layer 102. The resist layer 102 is formed inside of the recess 42 and the through hole 43 as well as on the surface of the bank 41. Subsequently, through holes 44 and 45 are formed in the base layer 30.

Figure 2E:
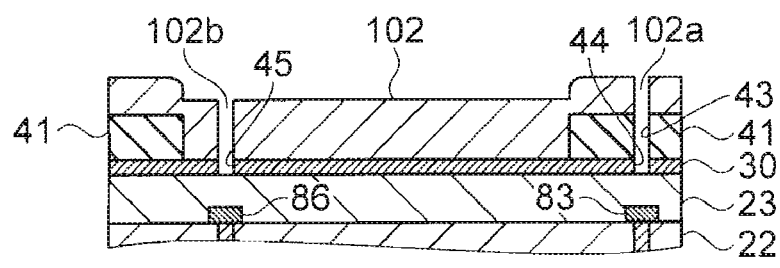

FIG. 2E shows a step for forming the through holes 44 and 45. First, the resist layer 102 is exposed and developed to form a resist pattern having openings 102a and 102b respectively corresponding to the through holes 44 and 45. After the resist pattern is formed, the through holes 44 and 45 are formed in the base layer 30 by etching. Then, a step for forming through holes 46 and 47 in the insulation layer 23 will follow.

Figure 2F:
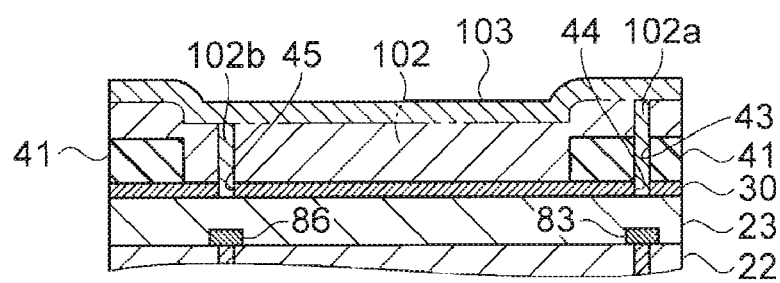

As shown in FIG. 2F, a resist layer 103 is formed on the top of the resist layer (resist pattern, here) 102. The resist layer 103 is formed inside of the through holes 44 and 45 as well as on the top surface of the resist layer 102. Then, as shown in FIG. 3A, a resist pattern having openings 103a and 103b is formed by exposure and development. The through holes 46 and 47 communicated with the surface of the pads 83 and 86 are formed in the insulation layer 23 by etching, and then cleaned.

The through hole 43, the through holes 44 and 45, the through holes 46 and 47 described above are formed in respective layers made of different materials deposited alternately, for example, $SiO_2$, SiN, and $SiO_2$. Therefore, etchants for the respective materials are different, requiring separate steps.

Next, a piezoelectric layer 50 is formed.

Figure 3B:
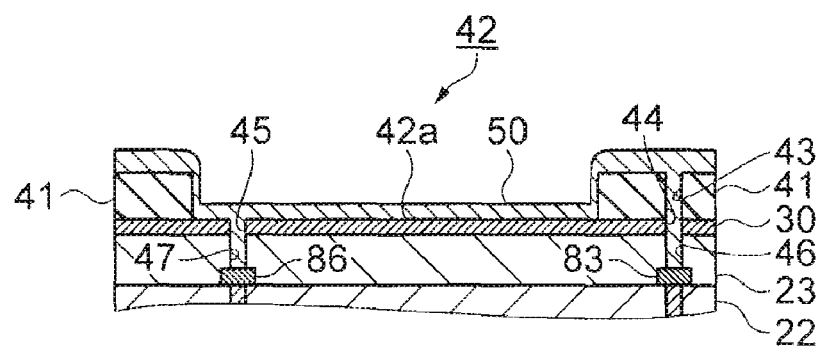

FIG. 3B shows a step for forming the piezoelectric layer 50. The piezoelectric layer 50 is formed on the surface of the bank 41 and the whole surface of a bottom 42a of the recess 42. The piezoelectric material goes into each of the through holes 43 to 47 formed in the former steps.

Next, the piezoelectric member 51 is formed.

Figure 3C:
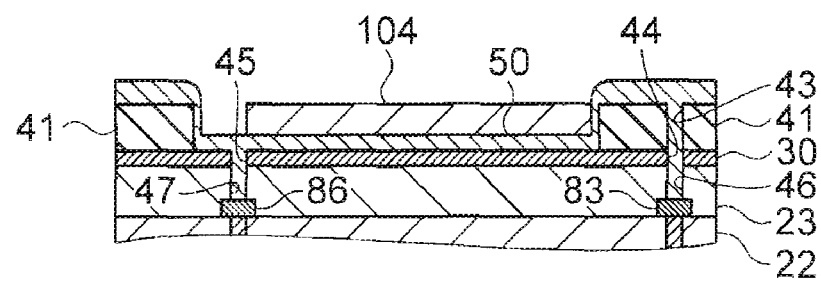
Figure 3D:
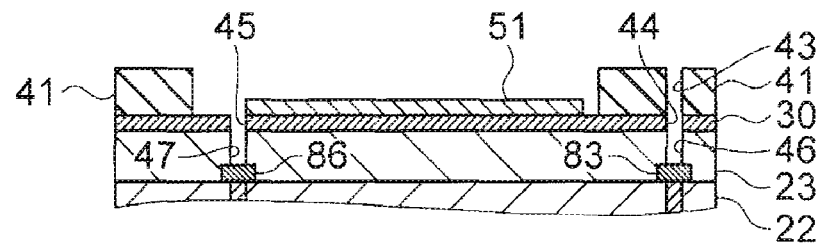

FIGS. 3C and 3D show a step for forming a piezoelectric member. First, a resist layer 104 is formed on the piezoelectric layer 50. Then, the resist layer 104 is exposed and developed to remove the resist layer surrounding the piezoelectric member 51 so as to form a resist pattern in a shape of the piezoelectric member 51. (see FIG. 3c)

As shown in FIG. 3D, the piezoelectric member 51 is formed in a desired shape by etching. Here, the piezoelectric material inside of each through hole described above is also removed. On the surface of the piezoelectric member 51 formed accordingly, the IDT electrode 60 and each via hole (typified by via holes 71 and 72) are formed.

Figure 3E:
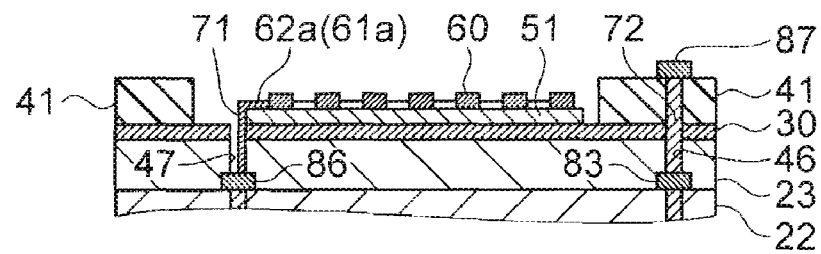

FIG. 3E shows a step for forming the IDT electrode 60. On the surface of the piezoelectric member 51, the IDT electrode 60 in which the GND electrode 61 and the input electrode 62 (common with the output electrode) mutually crossed each other is formed. The IDT electrode 60 is formed by vapor deposition or chemical vapor deposition (CVD). Ends of the bus bars on one side become the connection electrodes 61a and 62a extended to respective end portions, and are extended to the via hole 71 (71a and 71b) to couple to the pad 86. Further, the ends of the bus bars are also coupled to the other via hole 72, the pad 87, and the pad 83.

Then, as shown in FIG. 1B, the lid 90 is bonded as a sealing member to the top of the bank 41 for packaging. The surface of the bank 41 is positioned higher than the surface of the IDT electrode 60. Therefore, the bottom surface of the lid 90 cannot come in contact with the IDT electrode.

Through the above-described steps, the surface acoustic wave element 10 is formed.

According to the first embodiment described above, the piezoelectric member 51 and the IDT electrode 60 are formed in the recess 42 surrounded by the bank 41. Therefore, the surface of the IDT electrode 60 does not protrude above the surface of the bank 41, resulting in reducing a risk in which the IDT electrode is damaged by contact with jigs or the like during a circuit mounting step or the like later, and providing the surface acoustic wave element with high reliability.

In addition, the outer shape is within the region of the semiconductor substrate 20 without any protrusions, enabling downsizing.

Further, in a method like this, a surface acoustic wave element can be manufactured in a wafer state throughout a semiconductor manufacturing process. In addition, unlike JP-A-5-152881 (No. 3, page 4, FIGS. 2 and 3) described above, steps for mounting a surface acoustic wave element that is made into a chip, a sub substrate, and a module substrate are unnecessary, resulting in shortening the manufacturing process and reducing manufacturing cost.

Furthermore, the base layer 30 is formed on the whole surface of the insulation layer 23 having no protrusions, and then the surface of the base layer 30 is planarized. Therefore, the region for forming the surface acoustic wave element is superior in flatness and smoothness, providing the highly accurate resonance characteristic.

In addition, the base layer 30 is formed on the surface of the insulation layer 23 provided on the surface of the active side of the semiconductor substrate 20. This insulation layer 23 is made of silicon oxide ($SiO_2$). Therefore, an advantageous effect of SiN being formed easily by a common semiconductor manufacturing process is also expected. SiN is generally known as a material that is easy to be planarized by CMP.

Second Embodiment

Next, a method for manufacturing a surface acoustic wave element according to the second embodiment of the invention is now described with reference to the drawings. The second embodiment is based on the manufacturing method according to the first embodiment described above, but the base layer 30 has a different structure. Therefore, only the differences from the first embodiment will be illustrated and explained.

FIG. 4 is a schematic sectional-view showing a part of the manufacturing method according to the second embodiment. In the second embodiment, the base layer 30 is made of an Al layer 35 and a SiN layer 36.

First, the Al layer 35 is formed on the surface of the insulation layer 23 and planarized by CMP before the SiN layer is formed. It is preferable that the surface of this SiN layer 36 be planarized. The surface acoustic wave element is formed through the same manufacturing steps as those of the first embodiment (FIGS. 2B through 3E) described above after the step for forming the base layer 30.

When the Al layer 35 having electrical conduction is used as the base layer, through holes are simply formed not to couple the via holes 71 and 72 to any other than GND.

FIG. 5 shows a modification of the second embodiment. In this modification, the base layer 30 has a structure in which the SiN layer 36 and the Al layer 35 are formed sequentially in this order from the side of the insulation layer 23. In addition, on the surface of the Al layer 35, the SiN layer 37 is also formed, making a three-layered structure. Here, the surface of the Al layer 35 is planarized, The SiN layer 37 is not necessarily formed, however, formed as a protective layer when the piezoelectric member 51 is formed.

Therefore, according to the second embodiment and its modification described above, the Al layer is often used as a metal stopper for planarization and smoothing treatment in the semiconductor manufacturing process. Therefore the Al layer is superior in flatness and smoothness, providing high flatness and smoothness in the region for forming the surface acoustic wave element and thus providing a resonance characteristic with higher accuracy.

Third Embodiment

Next, a method for manufacturing the surface acoustic wave element 10 according to the third embodiment of the invention is now described with reference to the drawings. In the third embodiment, the bank 41 is formed by deposition using a droplet discharge method while the bank 41 in the first embodiment is formed by etching to formed the recess 42 after the bank layer 40 is formed according to the manufacturing method in the first embodiment (see FIGS. 2A through 3E) described above. Here, the completed configuration of the surface acoustic wave element 10 is similar to that of the first embodiment. Therefore, the same explanation in the first embodiment is omitted, and like numerals indicate like elements having the same functions to describe.

FIGS. 6A through 6H are schematic sectional-views showing major manufacturing steps for the surface acoustic wave element 10 according to the third embodiment. The insulation layers 21 to 23 and the pads 81 to 86 are formed on the top surface of the semiconductor substrate 20 with common manufacturing steps for the semiconductor manufacturing process. As shown in FIG. 2A, the surface of the insulation layer 23 is planarized by CMP, followed by formation of the base layer 30 made of SiN on the whole surface thereof.

Then, after the surface of the base layer 30 is planarized by CMP, the through holes 44 to 47 communicated with the surfaces of the pads 83 and 86 are formed.

Figure 6A:
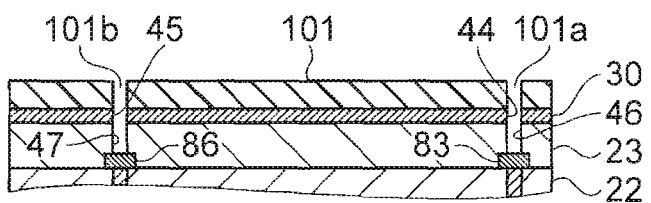
FIGS. 6A through 6H are schematic sectional-views showing major manufacturing steps for a surface acoustic wave element according to a third embodiment of the invention.

In FIG. 6A, the through holes 44 and 45, and the through holes 46 and 47 are respectively formed in the base layer 30 and the insulation layer 23. First, the resist layer 101 is formed on the surface of the base layer 30, and then exposed and developed to form a resist pattern having the openings 101a and 101b corresponding to the through holes 44 and 45. After the resist pattern is formed, the through holes 44 and 45 are formed by etching. Subsequently, although it is not shown by a figure, another resist layer is formed on the surface of the resist layer 101 (that is, the resist pattern). Then, a resist pattern having openings corresponding the though holes 46 and 47 is formed and etched to form the though holes 46 and 47.

Figure 6B:
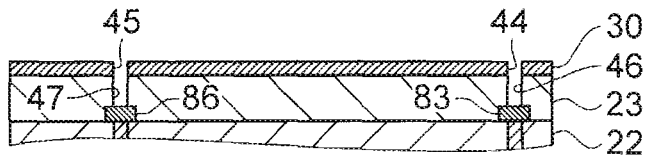

In FIG. 6B, the through holes 44 to 47 are formed. The method to form the through holes 44 to 47 follows the steps shown in FIGS. 2E through 3A of the first embodiment, described above.

After the through holes 44 to 47 are formed, the piezoelectric layer 50 is formed.

Figure 6C:
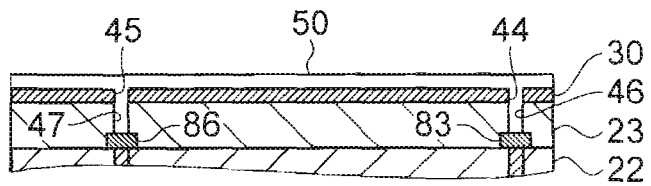

FIG. 6C shows a step for forming the piezoelectric layer 50. The piezoelectric layer 50 is formed on the whole surface of the base layer 30 in a predetermined thickness. Here, a part of the piezoelectric layer 50 goes into the inside of the through holes 44 to 47.

Next, the piezoelectric member 51 is formed to be in a predetermined shape.

Figure 6D:
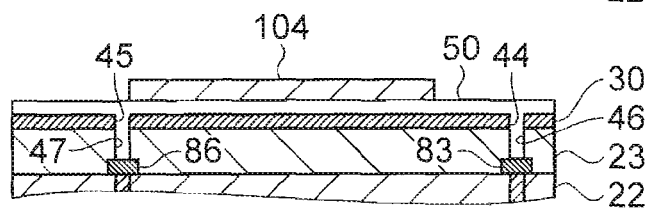
Figure 6E:
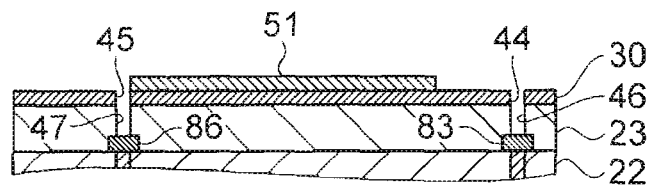

FIGS. 6D and 6E show a step for forming the piezoelectric member 51. First, as shown in FIG. 6D, the resist layer 104 is formed on the whole surface of the piezoelectric layer 50, and then exposed and developed to form a resist pattern corresponding to the piezoelectric member 51. Then, resist other than the resist pattern is removed by etching. Next, the piezoelectric member 51 is formed to be in a predetermined shape by etching.

In FIG. 6E, the piezoelectric member 51 is formed. As shown in FIG. 6E, the piezoelectric member 51 and the through holes 44 to 47 are formed on the surface of the base layer 30.

Next, the IDT electrode 60 is formed.

Figure 6F:
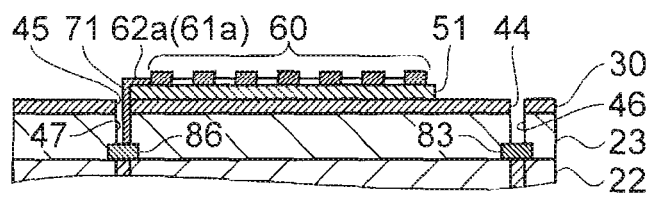

FIG. 6F shows a step for forming the IDT electrode 60. On the surface of the piezoelectric member 51, the IDT electrode 60 in which the GND electrode 61 and the input electrode 62 (common with the output electrode), which are shown in FIG. 1A, mutually crossed each other is formed. The IDT electrode 60 is formed by vapor deposition or chemical vapor deposition (CVD). Ends of the bus bars on one side become the connection electrodes 61a and 62a extended to respective end portions, and are extended to the via hole 71 (71a and 71b) to couple to the pad 86.

Next, the bank 41 is formed.

Figure 6G:
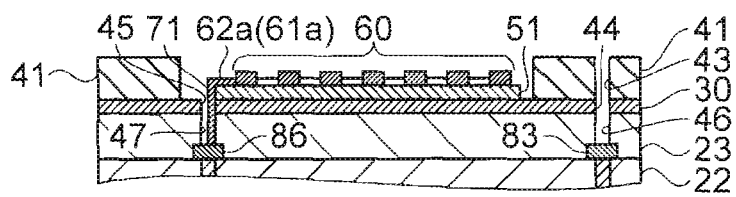

FIG. 6G shows a step for forming the bank 41. The bank 41 is formed to surround outside of a region including the piezoelectric member 51 and the IDT electrode 60 by depositing $SiO_2$ to make a predetermined shape with a droplet discharge method. Then, the bank 41 is solidified by heat treatment. Here, in the bank 41, the through hole 43 communicated with the pad 83 is also formed.

Following are further detailed descriptions of the method for forming the bank 41. The bank 41 of this embodiment is formed by a droplet discharge method. The droplet discharge method is a collective term for an inkjet method and the like to form a desired pattern on a base substrate by discharging liquid droplets using a droplet discharge device.

As a droplet discharge device, an electromechanical transducer using the piezoelectric element (piezo element) for the inkjet head, a method in which an electrothermal transducer is used as an energy generating element, continuous methods such as a charge control type and a pressure vibration type, an electrostatic suction method, and a method in which electromagnetic wave such as laser is emitted to generate heat so as to discharge liquid by the operation of the heat generation, may be adopted.

[Method for Forming the Bank 41]

First, a liquid member including a precursor material for $SiO_2$ is arranged in a bank forming area with the droplet discharge method (inkjet method). An example of the precursor material for $SiO_2$ included in the liquid member is silicon alkoxide Si (OR) 4(R=CH3, C2H5, C3H7, C4H9). However, other similar materials can be used.

A solvent or a dispersion medium to disperse the liquid member including the precursor material for $SiO_2$ preferably has a vapor pressure of from 0.001 to 200 mmHg in the room temperature. This is because, if the vapor pressure is over 200 mmHg, the dispersion medium can evaporate first when a coating film is formed by discharging, making it difficult to form a fine coating film. On the other hand, if the vapor pressure is less than 0.001 mmHg in the room temperature, drying speed becomes slow and the dispersion medium tends to remain in the coating film. As a result, it is hard to obtain a high-quality coating film after thermal treatment or optical treatment later. In particular, it is preferable that the vapor pressure of the dispersion medium be less than 50 mmHg. This is because the possibility of nozzle clogging caused by dryness when droplets are discharged from a droplet discharge head is reduced, enabling stable droplet discharge.

The solvent to be used is not particularly limited as long as it can disperse the liquid member well without causing aggregation thereof. Examples of the medium other than water can include: alcohols such as methanol, ethanol, propanol, and butanol; hydrocarbon solvents such as n-heptane, n-octane, decane, toluene, xylene, cymene, durene, indene, dipentene, tetrahydronaphthalene, decahydronaphthalene, and cyclohexylbenzene; ether solvents such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; and polar solvents such as propylene carbonate, gamma-butyrolactone, N-methyl-2-pyrrolidone, dimethylformamide, dimethyl sulfoxide, and cyclohexanone. Among them, water, alcohols, hydrocarbon-based solvents and the ether-based solvents are preferably used in terms of dispersibility of fine metal particles, stability of dispersion liquid, and applicability to the inkjet method. Water and hydrocarbon solvents are more preferably used. These cited disperse media might be used either singly or in mixture of two or more types.

When the precursor material for $SiO_2$ is dispersed in the dispersion medium to make the liquid member, the concentration of the precursor compound in the liquid member is preferably from 1 weight percent to 80 weight percent. In particular, it is desirable that the concentration be adjusted depending on the film thickness of the $SiO_2$ bank within this range. This is because, if the concentration is over 80 weight percent, the coating film can easily crack, and if the concentration is less than 1 weight percent, it takes a long period for drying to evaporate the dispersion medium, resulting in productivity reduction.

In addition, the liquid member including the precursor material for $SiO_2$ may include a small amount of a surface tension regulator such as fluorine, silicone, and nonion groups without interfering the function aimed.

The nonionic surface tension regulator serves to enhance the wettability of the dispersion medium to the object to be coated, improves leveling of the film, and prevents the occurrence of minute bumps and an orange peel-like surface of the coated film. The fine metal particle dispersion liquid prepared by adding the nonionic surface tension regulator preferably has viscosity of from 1 mPa·s to 50 mPa·s. If the viscosity is less than 1 mPa·s, the periphery of the nozzle of the droplet discharge head may be contaminated due to liquid leakage. Further, if the viscosity is more than 50 mPa·s, nozzle clogging may frequently occur.

Further, the liquid member including the bank precursor compound for $SiO_2$ prepared as above preferably has a surface tension within a range from 20 dyn/cm to 70 dyn/cm. If the surface tension is less than 20 dyn/cm, the wettability of the ink composition with respect to a surface of the nozzle is increased, rendering it likely to cause a flight curve, while if the surface tension is more than 70 dyn/cm, a meniscus shape at the tip of the nozzle is unstable, rendering the control of the discharge amount and discharge timing problematic.

The liquid member is arranged in a desired position to be in an even thickness by the droplet discharge head. Then, the liquid member arranged is heated. Subsequently, it is dried at a predetermined temperature for a predetermined period of time to remove the liquid in the liquid member. Further, after dried, it is degreased in the atmosphere at a predetermined high temperature (300 degrees centigrade, for example) for a predetermined period of time (30 minutes, for example), thereby an organic constituent coordinated to Si is thermally decomposed to be (—O—Si—O) n polymer. Then, each step for such coating, drying and degreasing is repeated for a predetermined times to make the polymer in a desirable thickness.

Thereafter, the polymer is heated at a predetermined temperature, preferably at from 350 to 400 degrees centigrade, even more preferably at 400 degrees centigrade, under oxygen flow in a rapid thermal annealing (RTA) chamber. Then, the polymer is sintered as shown in FIG. 6G to form a $SiO_2$ bank in the thickness of about 4 μm.

For the conditions of the heat treatment, conditions commonly used can be adopted with no particular limitations. For example, the heat treatment can be performed in the air, and also in an environment of inactive gas such as nitrogen, argon, or helium when necessary. The temperature of the heat treatment is appropriately determined in consideration of the boiling point (vapor pressure) and pressure of the dispersion medium, and thermal behavioral properties of fine metal particles. However, in particular, it is preferably 400 degrees centigrade or less. If the temperature is 400 degrees centigrade or less, thermal influence on a circuit element and Al wiring in the semiconductor substrate 20 can be reduced.

A hot plate or electric furnace is usually used as a heat method for the heat treatment. Alternatively, lamp annealing can also be employed.

Further, examples of light sources for the lamp annealing are not particularly limited, but can include: infrared lamps, xenon lamps, YAG lasers, argon lasers, carbon dioxide lasers, and excimer lasers of XeF, XeCl, XeBr, KrF, KrCl, ArF, ArCl, or the like. Such light sources are typically used with the output range from 10 W to 5000 W, but in the embodiment, one with the range from 100 W to 1000 W is adequate.

Figure 6H:
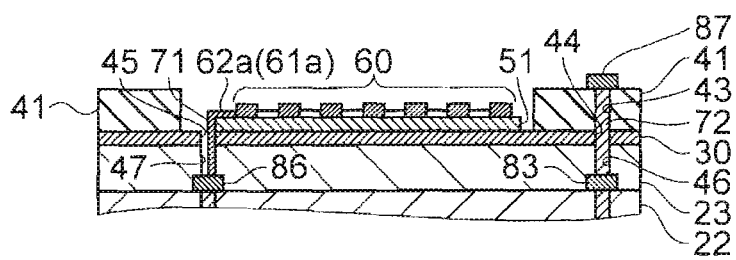

After the bank 41 is formed as above, as shown in FIG. 6H, the via hole 72 coupled to the pad 87 from the surface of the bank 41, and the pad 87 are formed. Then, as shown in FIG. 1B, the lid 90 is bonded and packaged to form the surface acoustic wave element 10.

Therefore, according to the third embodiment described above, the bank 41 can be formed in an arbitrary shape by the droplet discharge method while the through hole 43 to form the via hole 72 is formed in a part of the bank 41 in the same process, thereby manufacturing process can be shortened.

Further, the piezoelectric member 51 and the IDT electrode 60 are formed to be flush with each other on the base layer 30 that is planarized and has no protrusions. Therefore, the piezoelectric member 51 and the IDT electrode 60 are formed more easily than the method to form them in the recess preliminarily formed, which is described in the first embodiment.

Furthermore, the precursor compound for $SiO_2$ can be a liquid member including an organic metal compound Si(OR)4(R=CH3, C2H5, C3H7, C4H9) containing Si to be easily formed in a desired bank shape and height. Then, it is solidified with heat treatment, easily forming a bank made of $SiO_2$ in a desired shape.

In addition, the temperature of the heat treatment is in a range from 350 to 400 degrees centigrade, ensuring the liquid member to be solidified, and further, preventing heat influence on a circuit element and Al wiring on the semiconductor substrate 20.

Fourth Embodiment

Next, a method for manufacturing the surface acoustic wave element 10 according to the fourth embodiment of the invention is now described with reference to the drawings. In the fourth embodiment, the method to form the bank 41 follows the manufacturing method described in the third embodiment described above. After the bank 41 is formed, the piezoelectric member 51 and the IDT electrode 60 are formed. Here, steps that are different from those in the third embodiment are mainly described, and like numerals indicate like elements having the same functions to describe.

Figure 7A:
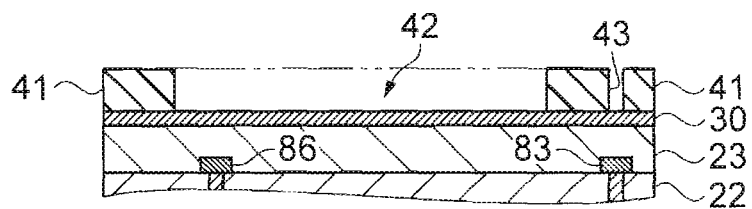
FIGS. 7A through 7H are schematic sectional-views showing major manufacturing steps for a surface acoustic wave element according to a fourth embodiment of the invention.

FIGS. 7A though 7H are the schematic sectional-views showing the method for manufacturing the surface acoustic wave element 10 according to this embodiment.

FIG. 7A shows a step for forming the bank 41. The bank 41 is formed on the peripheral of the surface of the base layer 30 in a predetermined shape and height with the droplet discharge method. For the droplet discharge method, the same method and conditions as those in the third embodiment described above are used. The bank 41 forms the recess 42. At the bottom of the recess 42, a part of the planarized surface of the base layer 30 is exposed. Further, the through hole 43 communicated with the pad 83 is formed by the same step.

Then, through holes communicated with the pads 83 and 86 are formed in the base layer 30.

Figure 7B:
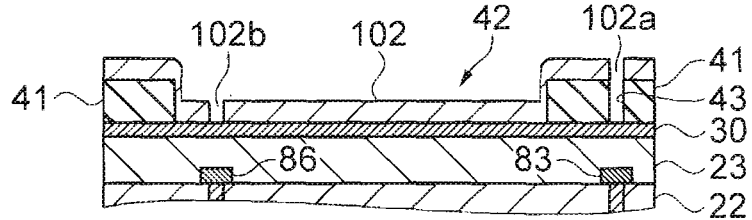

FIGS. 7B through 7E show steps for forming the through holes 44 to 47. First, as shown in FIG. 7B, the resist layer 102 is formed on the bottom of the recess 42, which is the surface of the base layer 30, and the surface of the bank 41, followed by exposing and developing to form a resist pattern having the openings 102a and 102b corresponding to the through holes 44 and 45.

Figure 7C:
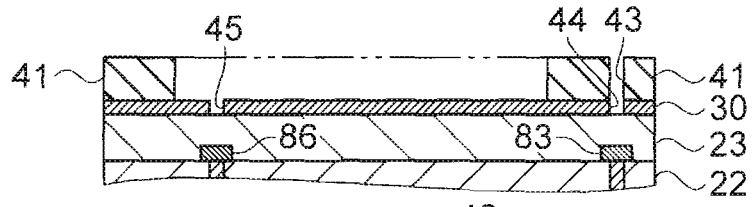

FIG. 7C shows a step for forming the through holes 44 and 45. The through holes 44 and 45 are formed by etching. Then the resist layer 102 is removed and cleaned.

Then, the through holes 46 and 47 are formed in the insulation layer 23.

Figure 7D:
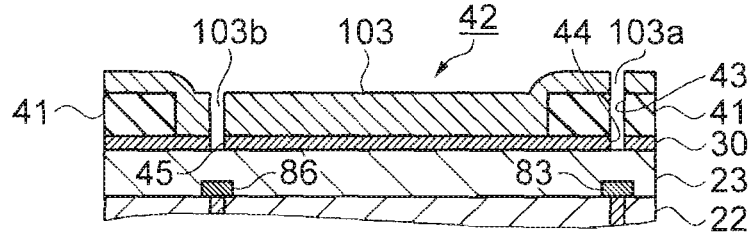

First, as shown in FIG. 7D, the resist layer 103 is formed on the bottom of the recess 42, which is the surface of the base layer 30, and the surface of the bank 41, followed by exposing and developing to form a resist pattern having the openings 103a and 103b corresponding to the through holes.

Figure 7E:
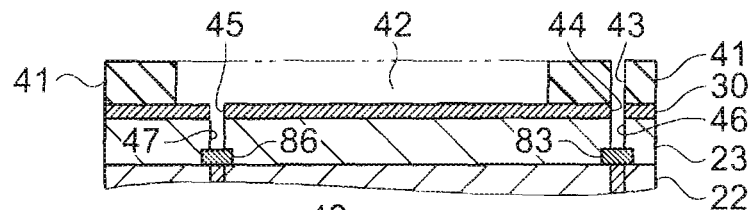

Then, the through holes 46 and 47 are formed in the insulation layer 23 by etching. (FIG. 7E)

Figure 7F:
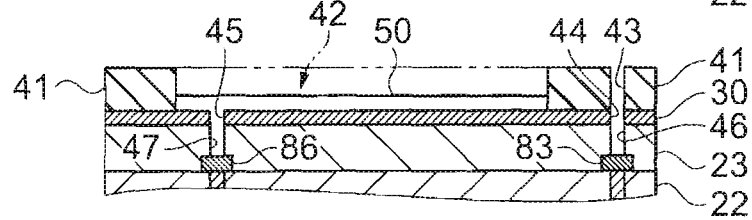
Figure 7G:
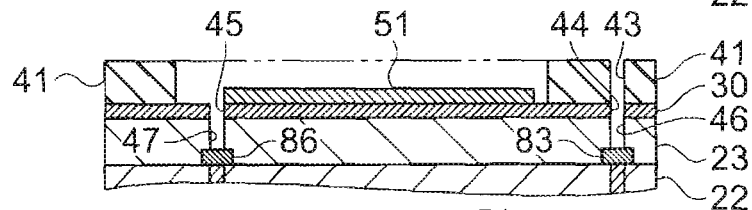

Subsequently, the piezoelectric layer 50 is formed on the surface of the base layer 30 in the recess 42 as shown in FIG. 7F.

Then, a resist layer (not shown) is formed on the surface of the piezoelectric layer 50, followed by exposing and developing to form a resist pattern to be in a shape of the piezoelectric member 51. The resist pattern is etched to form the piezoelectric member 51. (see FIG. 7G) Next, the resist layer is removed to form the IDT electrode 60.

Figure 7H:
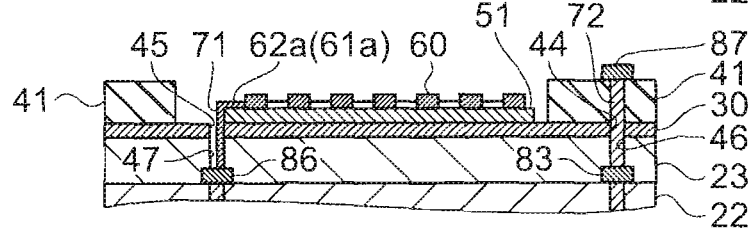

FIG. 7H shows a step for forming the IDT electrode. The IDT electrode is formed by the same method and steps as those in the first embodiment (see FIG. 3E) described above. That is, the IDT electrode 60, the connection electrodes 61a and 62a, the via holes 71 and 72, and the pad 87 are formed here. Then, the lid 90 is bonded for packaging (see FIG. 1B), completing the surface acoustic wave element 10.

According to the manufacturing method in the fourth embodiment, the surface acoustic wave element 10 having the same structure as that in the first embodiment (see FIGS. 1A and 1B) is accomplished, providing the same advantageous effect.

Further, after the bank 41 is formed, the steps to form the piezoelectric member 51 and the IDT electrode 60 will follow. Therefore, when the bank 41 is formed, the surface of the base layer 30 can avoid being in contact with an etchant or the like, keeping the surface of the base layer 30 as it is planarized, improving bonding reliability with the piezoelectric member 51.

Further, when the bank 41 is formed, the surface of the base layer 30 is one plane without having any protrusions such as the IDT electrode. An advantageous effect of this is that, for example, the surface can avoid a damage caused by contact of a head nozzle with the IDT electrode.

Further, the third and fourth embodiments described above can also have the laminate structure of SiN and Al for the structure of the base layer 30 as well as those in the second embodiment and the modification (see FIGS. 4 and 5).

It is to be noted that this invention is not limited to the aforementioned embodiments but includes various modifications or improvements within a scope of a purpose of this invention.

As it is described above, the first through fourth embodiments can provide the method for manufacturing a surface acoustic wave element that achieves being downsized and low profiled, and easy to be packaged, moreover highly reliable, and the surface acoustic wave element itself manufactured by the method.

The entire disclosure of Japanese Patent Application No. 2006-012058, filed Jan. 20, 2006 is expressly incorporated by reference herein.

What is claimed is:

1. A method for manufacturing a surface acoustic wave element having an interdigital transducer electrode formed on a semiconductor substrate, comprising:
   a) forming an insulation layer on a surface of an active side of the semiconductor substrate, said insulation layer having a whole top surface;
   b) forming a base layer on the whole surface of the insulation layer;
   c) planarizing a surface of the base layer;
   d) forming a piezoelectric member on the planarized surface of the base layer;
   e) forming the interdigital transducer electrode on a surface of the piezoelectric member; and
   f) forming a bank being higher than a height from the surface of the base layer to the surface of the interdigital transducer electrode on a peripheral of the surface of the base layer, thereby surrounding the piezoelectric member with said bank.

2. The method for manufacturing a surface acoustic wave element according to claim 1, wherein step b) includes forming a single insulation layer.

3. The method for manufacturing a surface acoustic wave element according to claim 1, wherein step b) includes forming the base layer by laminating an Al layer and the insulation layer, and planarizing at least a surface of the Al layer.

4. The method for manufacturing a surface acoustic wave element according to claim 1, wherein step f) includes forming a bank layer to be as high as the bank on the surface of the base layer and forming a recess by removing the bank layer by etching to reach the surface of the base layer in a region to form the piezoelectric member, and the piezoelectric member in step d) is formed on a bottom of the recess.

5. The method for manufacturing a surface acoustic wave element according to claim 1, wherein step e) is followed by step f), and step f) includes: forming the bank in a predetermined shape by discharging a liquid member having a precursor compound for $SiO_2$ in a region to form the bank on the peripheral of the surface of the base layer using a droplet discharge method; and solidifying the liquid member by heat treatment.

6. The method for manufacturing a surface acoustic wave element according to claim 5, wherein the bank is made of $SiO_2$ and formed by solidifying a precursor compound for $SiO_2$ being a liquid member including an organic metal compound Si (OR) 4(R=CH3, C2H5, C3H7, C4H9) with heat treatment.

7. The method for manufacturing a surface acoustic wave element according to claim 5, wherein a temperature for the heat treatment is in a range from 350 to 400 degrees centigrade.

8. The method for manufacturing a surface acoustic wave element according to claim 1, wherein step f) includes:
   forming the bank in a predetermined shape by discharging a liquid member having a precursor compound for $SiO_2$ in a region to form the bank on the peripheral of the surface of the base layer using a droplet discharge method; and
   solidifying the liquid member by heat treatment, and step f) is followed by forming the piezoelectric member on the planarized surface of the base layer in a recess formed by the bank and step e).

* * * * *